Inventor
HENRY M. BACH
By Herman L. Gordon
Attorney

Inventor
HENRY M. BACH

By Herman L. Gordon
Attorney

Patented Nov. 7, 1950 2,529,443

UNITED STATES PATENT OFFICE 2,529,443

MULTIBAND SUPERHETERODYNE RADIO RECEIVER HAVING A PUSH-BUTTON STATION SELECTOR

Henry M. Bach, Woodmere, N. Y., assignor to Premier Crystal Laboratories, Incorporated, New York, N. Y.

Application October 22, 1945, Serial No. 623,680

2 Claims. (Cl. 250—20)

This invention relates to radio receiving equipment, and more particularly to radio receiving equipment of the superheterodyne type.

A main object of the invention is to provide a novel and improved method and means of radio reception wherein tuning is accomplished by very simple manual operations and wherein extreme tuning accuracy, stability, and reliability of performance is obtained.

A further object of the invention is to provide an improved method of radio receiver operation wherein tuning is accomplished of any desired signal frequency in a given band of frequencies, such as the broadcast band or a short wave band, by the manipulation of a pair of selected push button elements.

A still further object of the invention is to provide an improved radio receiving structure employing a plurality of crystal-controlled component oscillators, the performance of said structure being such that tuning may be accomplished over a desired band of signal frequencies.

Other objects and advantages of the invention will become apparent from the following description and claims, and from the accompanying drawings, wherein:

Figures 1, 2:
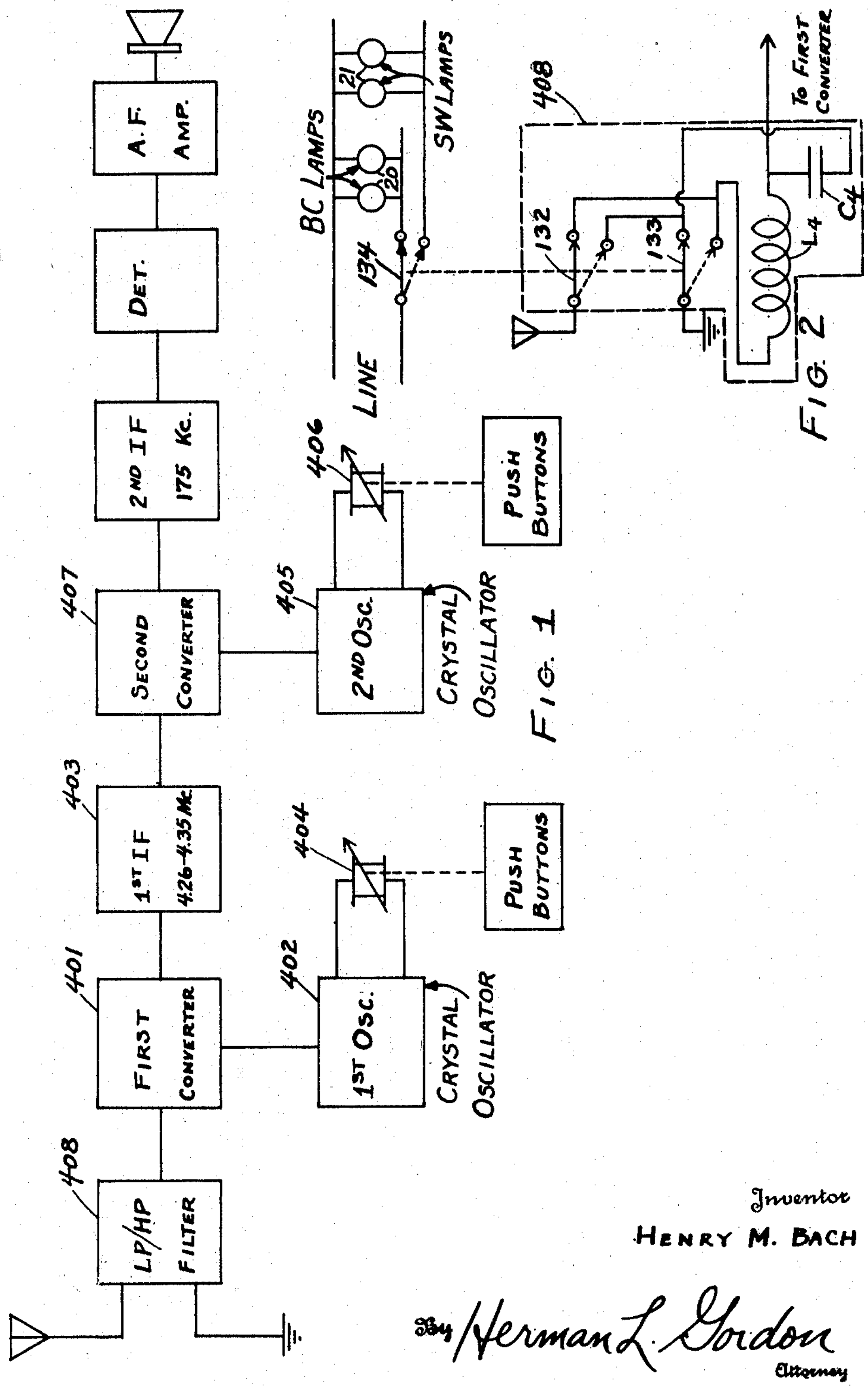
Figure 1 is a schematic block diagram illustrative of a radio receiving system constructed in accordance with and employing the method of this invention.
Figure 2 is a schematic wiring diagram of a low pass-high pass filter employed in the radio receiving system of Figure 1.

In the conventional superheterodyne radio receiver the oscillator is required to produce a frequency which, when mixed with the input signal frequency, produces the intermediate frequency. Ordinarily the oscillator is tuned by a first variable condenser which is ganged with another variable condenser which controls the tuning of the input stage of the receiver. The oscillator condenser must be carefully adjusted to "track" with the main tuning condenser to produce a substantially constant intermediate frequency value for all signals over the tuning band. Perfect tracking is practically impossible to obtain, so that ordinarily, compromise adjustments are made whereby the condensers are tracked at three points over the tuning band.

Even if the condensers are initially adjusted for satisfactory tracking, they may be subsequently affected by conditions of temperature, vibration and the like, so as to become misaligned and to thereby reduce the overall sensitivity of the receiver either at certain points in the tuning band or entirely over said band. This condition may be aggravated by further mechanical misalignment where push buttons or other mechanical devices are employed to establish the correct setting of the ganged tuning condensers, or, where no tuned input stage is employed, merely by the thermal warping or axial shifting of the plates of the oscillator condenser.

It is a common fact, therefore, that after a period of use, a superheterodyne receiver, manually operated by means either of the ganged condenser type or of the type employing push buttons, will lose sensitivity and selectivity, and in a majority of cases the deterioration in performance can be traced to the misalignment of the oscillator condenser.

It is a prime purpose of this invention to provide a system of tuning for a superheterodyne receiver wherein no variable oscillator condenser is employed in tuning the receiver and wherein the initial conditions for producing the correct value of intermediate frequency at the input side of the intermediate frequency amplifier are permanently maintained for all channels of a tuning band.

In the broadcast band extending from 500 kc. to 1590 kc., all transmitting stations operate on multiples of 10 kc., such as 630 kc., 710 kc., 1500 kc., etc. In tuning the receiver over this band, it is therefore only necessary to tune to multiples of 10 kc. to receive any station in the band. In the range from 500 to 1590 kc. there are 110 channels respectively separated by 10 kc. Therefore in order to tune the receiver to any station in this band it must be possible to set the oscillator or its equivalent to obtain a suitable value of frequency which will be variable at least in 10 kc. steps and which will combine with any signal frequency in the band to produce the intermediate frequency of the receiver.

It is also desirable to eliminate the possibilities of mistuning such as are inherent in the conventional condenser-tuned receiver employing either manual tuning or push-button mechanical tuning, such mistuning usually causing serious distortion. This problem has heretofore been dealt with by employing a crystal-controlled oscillator to beat with the signal frequency to produce the desired intermediate frequency value. As can be readily seen, however, 110 crystals would be required to operate the oscillator at all of the required frequencies for receiving all transmitting stations over the broadcast band, and appropriate switching means would have to be furnished for selectively connecting the crystals into the oscillator circuit. This would result in a very cumbersome arrangement.

In accordance with this invention, the number of crystals necessary to tune to all stations over a desired band is materially reduced by employing a plurality of crystal controlled oscillators in decade arrangement in place of the single oscillator heretofore employed.

Figure 1 shows in outline form the application of the tuning system of this invention to a receiver employing two heterodyne stages. In the system of Figure 1 the signal input is heterodyned in the first converter stage 401 with a relatively high frequency crystal-controlled voltage produced by the first oscillator 402, resulting in a first intermediate frequency in the neighborhood of 4.3 megacycles. The first intermediate frequency amplifier 403 is arranged to have very low attenuation over a well defined band of frequencies ranging, say, from 4.26 to 4.35 megacycles, thus acting as a band pass filter for this band of frequencies. The first oscillator 402 is selectively controlled by a variable crystal arrangement 404 comprising a bank of eleven crystals differing in frequency by 100 kc. For tuning the system to the broadcast band of frequencies from 500 to 1590 kc. these crystals range from 4850 kc. to 5850 kc. For the band of frequencies from 500 to 590 kc., the first oscillator 402 is connected to the 4850 kc. crystal. A 500 kc. signal will beat with 4850 kc. to produce a 4.35 megacycle first intermediate frequency, whereas a 590 kc. signal will beat with 4850 kc. to produce a 4.26 megacycle first intermediate frequency. Therefore any signal between 500 kc. and 590 kc. will produce an intermediate frequency which will be passed by the first intermediate frequency amplifier 403 when the 4850 kc. crystal is connected to the first oscillator. The following table indicates the respective 100 kc. bands tuned by the first oscillator crystals:

| First Osc. Crystal Freq. | Signal kc. |
|---|---|
| 4850 kc. | 500 to 590 |
| 4950 kc. | 600 to 690 |
| 5050 kc. | 700 to 790 |
| 5150 kc. | 800 to 890 |
| 5250 kc. | 900 to 990 |
| 5350 kc. | 1000 to 1090 |
| 5450 kc. | 1100 to 1190 |
| 5550 kc. | 1200 to 1290 |
| 5650 kc. | 1300 to 1390 |
| 5750 kc. | 1400 to 1490 |
| 5850 kc. | 1500 to 1590 |

The second oscillator 405 must provide a frequency which will beat with the first intermediate frequency to accurately produce in the second converter stage 407 a second intermediate frequency of 175 kc. Since the first intermediate frequency may have any 10 kc. value between 4260 kc. and 4350 kc., the second oscillator crystal bank, indicated as variable crystal arrangement 406, must comprise a series of ten crystals differing by 10 kc. This series may begin at 4085 kc.

and extend to 4175 kc. in accordance with the following table:

| Second Osc. Crystal Frequency | Last two digits of Signal kc. |
|---|---|
| 4085 kc. | 90 |
| 4095 kc. | 80 |
| 4105 kc. | 70 |
| 4115 kc. | 60 |
| 4125 kc. | 50 |
| 4135 kc. | 40 |
| 4145 kc. | 30 |
| 4155 kc. | 20 |
| 4165 kc. | 10 |
| 4175 kc. | 00 |

To tune to a 630 kc. signal, for example, the first oscillator 402 is connected to the 4950 kc. crystal. The first oscillator frequency beats with the 630 kc. signal to produce a first intermediate frequency of 4320 kc. The 4145 kc. crystal is connected to the second oscillator 405 in accordance with the above table wherein the 4145 kc. crystal appears opposite "30," representing the last two digits of the desired channel. The 4145 kc. second oscillator frequency beats with the first intermediate frequency of 4320 to produce the desired 175 kc. second intermediate frequency voltage which carries the signal modulations.

The above described system of Figure 1 may also be employed to tune to any one of the 110 channels 10 kc. apart extending from 9110 kc. to 10,200 kc. Thus, a 9110 kc. signal will beat with the 4850 kc. crystal frequency of the first oscillator 402 to produce an intermediate frequency of 4260 kc., and a 9200 kc. signal will beat with the 4850 kc. frequency to produce an intermediate frequency of 4350 kc. Similarly, a 10,110 kc. signal will beat with the 5850 kc. crystal frequency to produce the 4260 kc. intermediate frequency and a 10,200 kc. signal will beat with said 5850 kc. crystal frequency to produce the 4350 kc. intermediate frequency.

By an appropriate adjustable low-pass-high-pass filter 408 ahead of the first converter 401 the system may be set for either broadcast or short wave reception. As shown in Figure 2, filter 408 comprises reactors $L_4$ and $C_4$ and a switching arrangement including a pair of switch arms 132 and 133 mechanically linked together. The connections are so arranged that in one position of switch arms 132 and 133, for example, the position shown in Figure 2, the filter functions as a low-pass filter to pass broadcast frequencies and to exclude higher frequencies, whereas in the other position of said switch arms, shown in dotted view in Figure 2, the filter functions as a high-pass filter, passing the higher frequencies and excluding the broadcast frequencies.

Figure 3:
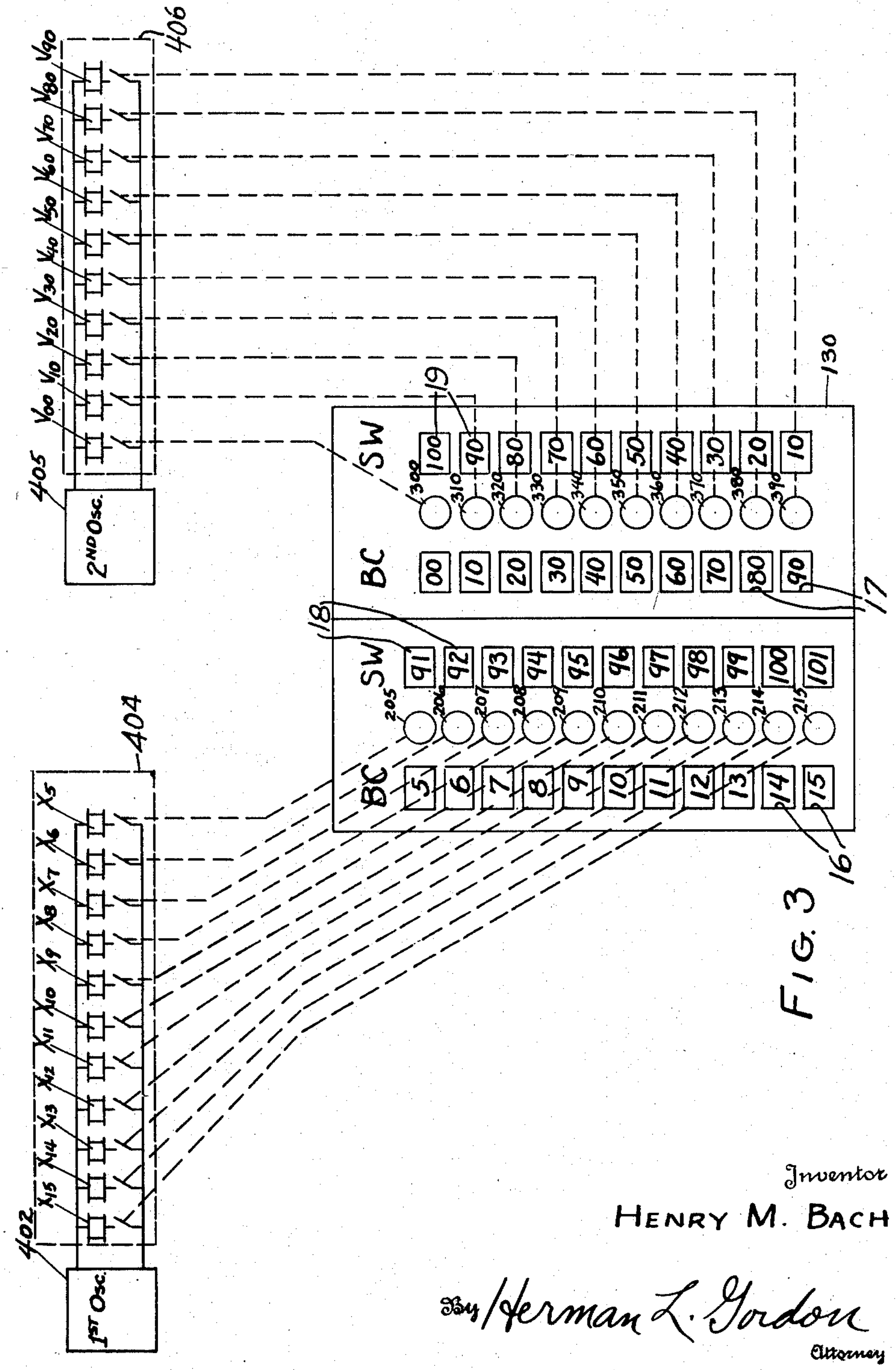
Figure 3 is a diagrammatic view of a push button panel employed in the system of Figure 1 showing the operative relationship of the push button elements of said panel with circuit controlling elements employed in said system.

Referring to Figure 3, a detailed arrangement is shown for tuning the system of Figure 1. Mounted on a panel board 130 are two rows of conventional single-pole single-throw push button switches, there being eleven push button switches, numbered from 205 to 215 respectively in the left row and ten push button switches, numbered respectively from 300 to 390 in the right row.

The eleven push button switches 205 to 215 respectively control the circuits for a first bank 404 of eleven crystals indicated as $X_5$, $X_6$, $X_7$, $X_8$, $X_9$, $X_{10}$, $X_{11}$, $X_{12}$, $X_{13}$, $X_{14}$, and $X_{15}$, differing respectively in frequency by 100 kc. as above described, and adapted to be selectively connected by actuation of the push button switches 205 to 215 as the frequency controlling element of first oscillator 402.

The ten push button switches 300 to 390 respectively control the circuits for a second bank 406 of crystals, indicated as $V_{00}$, $V_{10}$, $V_{20}$, $V_{30}$, $V_{40}$, $V_{50}$, $V_{60}$, $V_{70}$, $V_{80}$, and $V_{90}$, differing respectively in frequency by 10 kc. as above described, and adapted to be selectively connected by actuation of the push button switches 300 to 390 as the frequency controlling element of second oscillator 405.

The first bank of crystals $X_5$ to $X_{15}$ corresponds to variable crystal arrangement 404 and the second bank of crystals $V_{00}$ to $V_{90}$ corresponds to variable crystal arrangement 406 of Figure 1.

A conventional mechanical arrangement is provided whereby any push button in each row may be actuated to close its corresponding switch contacts, all other push buttons of each row being released to maintain their switch contacts open. This enables any one of the crystals $X_5$ to $X_{15}$ to be connected to oscillator 402 and any one of the crystals $V_{00}$ to $V_{90}$ to be connected to oscillator 405 at a given time.

Oscillators 402 and 405 may be conventional oscillators similar to the Pierce type.

Crystals $X_5$ to $X_{15}$ are separated in frequency by 100 kc. and crystals $V_{00}$ to $V_{90}$ are separated in frequency by 10 kc. The frequency of oscillator 402 can therefore be varied in 100 kc. steps and the frequency of oscillator 405 can be varied in 10 kc. steps.

Provided on panel 130 at one side, for example, at the left of each of push button switches 205 to 215, is a translucent window 16 carrying a number, the numbers being from 5 consecutively to 15, corresponding to 100 kc. intervals from 500 kc. to 1500 kc. Above this row of windows the panel may carry identifying indicia such as "BC" to indicate that this row of windows is for the broadcast band. Similarly, translucent windows 17 are provided at the left of push button switches 300 to 390, each window carrying a number, the numbers being 00 to 90 corresponding to 10 kc. intervals.

At the right of push button switches 205 to 215 are translucent windows 18 carrying numbers from 91 consecutively to 101, corresponding to 100 kc. intervals from 9100 kc. to 10,100 kc., and at the right of push button switches 300 to 390 are translucent windows 19 carrying numbers 100 to 10, corresponding to 10 kc. intervals in the respective 100 kc. steps. The right hand windows may carry identifying indicia captions such as "SW" to indicate that these windows are for the short wave band. It will be noted that the numbering of the "SW" windows for push button switches 300 to 390 is reversed in sequence with respect to the numbering for the "BC" windows. By consulting the crystal frequency tables given below it will be seen that this is necessary in order to properly select the frequency indicated by the additive combination of the numbers associated with the first row of push buttons and the second row of push buttons.

Suitable lamps 20 and 21 controlled by a switch arm 134 mechanically coupled to the actuating mechanism for switch arms 132 and 133 of adjustable filter 408 may be provided behind the respective translucent windows to illuminate respectively the "BC" windows when filter 408 is set for broadcast reception and the "SW" windows when the filter is set for short wave reception.

In the specific form of the invention herein described the crystals illustrated in Figure 3 have frequencies given by the following table:

| Crystals for oscillator 402 | Frequency |
|---|---|
| | Kc. |
| $X_5$ | 4850 |
| $X_6$ | 4950 |
| $X_7$ | 5050 |
| $X_8$ | 5150 |
| $X_9$ | 5250 |
| $X_{10}$ | 5350 |
| $X_{11}$ | 5450 |
| $X_{12}$ | 5550 |
| $X_{13}$ | 5650 |
| $X_{14}$ | 5750 |
| $X_{15}$ | 5850 |

| Crystals for oscillator 405 | Frequency |
|---|---|
| | Kc. |
| $V_{00}$ | 4175 |
| $V_{10}$ | 4165 |
| $V_{20}$ | 4155 |
| $V_{30}$ | 4145 |
| $V_{40}$ | 4135 |
| $V_{50}$ | 4125 |
| $V_{60}$ | 4115 |
| $V_{70}$ | 4105 |
| $V_{80}$ | 4095 |
| $V_{90}$ | 4085 |

While certain numerical values have been mentioned in connection with the method and elements of the specific embodiment of the invention described above, these values are merely illustrative of a practical example of the invention and are not to be construed as limiting. Other intermediate frequency values may be employed than those specified above, and of course, the crystal frequencies employed in the decade oscillators would be changed in accordance with the different intermediate frequency values employed. The new crystal frequencies could be readily calculated by one skilled in the art.

While a certain specific embodiment of a method and means for receiver tuning has been disclosed in the foregoing description, it will be understood that numerous modifications within the spirit of the invention may occur to those skilled in the art. Therefore it is intended that no limitations be placed on the invention other than as defined by the scope of the appended claims.

What is claimed is:

1. Means for tuning a radio receiver comprising an inductance, a capacitance, a double-pole double-throw switch, the first pole of said switch having first and second contacts associated therewith and the second pole of the switch having third and fourth contacts associated therewith, the switch being arranged so that in a first position thereof the poles respectively engage the first and third contacts and in a second position thereof the poles respectively engage the second and fourth contacts, the inductance having one terminal thereof connected to said first and fourth contacts, the capacitance having one terminal thereof connected to the second and third contacts, the remaining terminals of the inductance and capacitance being connected together and defining an output terminal, whereby in the first position of said switch the inductance is connected between said first pole and said output terminal, providing a low-pass arrangement and in the second position of said switch the capacitance is connected between said first pole and said output terminal, providing a high pass arrangement, so that in the first position the arrangement excludes frequencies above a predetermined value and in the second position the arrangement excludes frequencies below said predetermined value, a first variably tuned oscillator, means for combining the output of said first oscillator with radio frequency energy at the said output terminal, a second variably tuned oscillator, and means for combining the output of said second oscillator with the resultant frequency derived from combining the output of said first oscillator and the energy at said output terminal.

2. Means for tuning a radio receiver comprising an inductance, a capacitance, a double-pole double-throw switch, the first pole of said switch having first and second contacts associated therewith and the second pole of said switch having third and fourth contacts associated therewith, the switch being arranged so that in a first position thereof the poles respectively engage the first and third contacts and in a second position thereof the poles respectively engage the second and fourth contacts, the inductance having one terminal thereof connected to said first and fourth contacts, the capacitance having one terminal thereof connected to the second and third contacts, the remaining terminals of the inductance and capacitance being connected together and defining an output terminal, whereby in the first position of said switch the inductance is connected between said first pole and said output terminal, providing a low-pass arrangement and in the second position of said switch the capacitance is connected between said first pole and said output terminal, providing a high-pass arrangement, so that in the first position the arrangement excludes frequencies above a predetermined value and in the second position the arrangement excludes frequencies below said predetermined value, a first oscillator adapted for crystal control, a first bank of crystals separated in frequency by a constant relatively large value, means for selectively connecting any one of said first crystals to said first oscillator, means for combining the output of said first oscillator with radio frequency energy at the said output terminal, a second oscillator adapted for crystal control, a second bank of crystals separated in frequency by a constant relatively small value, means for selectively connecting any one of said second crystals to said second oscillator, and means for combining the output of said second oscillator with the resultant frequency derived from combining the output of the first oscillator and the energy at said output terminal.

HENRY M. BACH.

REFERENCES CITED

The following references are of record in the file of this patent:

UNITED STATES PATENTS

| Number | Name | Date |
|---|---|---|
| 2,061,740 | Rechnitzer | Nov. 24, 1936 |
| 2,074,800 | Mountjoy | Mar. 23, 1937 |
| 2,145,676 | Zepler | Jan. 31, 1939 |
| 2,151,810 | Siemens | Mar. 28, 1939 |
| 2,245,385 | Carlson | June 10, 1941 |
| 2,323,924 | Mayer | July 13, 1943 |
| 2,354,148 | Shaw | July 18, 1944 |
| 2,383,322 | Koch | Aug. 21, 1945 |

FOREIGN PATENTS

| Number | Country | Date |
|---|---|---|
| 339,316 | Great Britain | Dec. 5, 1930 |